United States Patent
Light et al.

(10) Patent No.: US 6,255,723 B1
(45) Date of Patent: Jul. 3, 2001

(54) LAYERED LEAD STRUCTURES

(75) Inventors: David Light, Los Gatos; John W. Smith, Palo Alto; Thomas H. DiStefano, Monte Sereno; David R. Baker, Cupertino; Hung-Ming Wang, San Jose, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/179,273

(22) Filed: Oct. 27, 1998

Related U.S. Application Data
(60) Provisional application No. 60/079,194, filed on Mar. 24, 1998, provisional application No. 60/065,992, filed on Nov. 14, 1997, and provisional application No. 60/063,316, filed on Oct. 27, 1997.

(51) Int. Cl.$^7$ .................................................. H01L 23/495
(52) U.S. Cl. .......................... 257/677; 257/666; 257/766; 257/764
(58) Field of Search .................................. 257/666, 677, 257/766, 764

(56) References Cited

U.S. PATENT DOCUMENTS

| | | | |
|---|---|---|---|
| 5,001,546 | * | 3/1991 | Butt . |
| 5,384,204 | * | 1/1995 | Yumoto et al. . |
| 5,489,749 | | 2/1996 | "DiStefano et al." ................ 174/261 |
| 5,491,302 | | 2/1996 | "DiStefano et al." ................ 114/260 |
| 5,518,964 | | 5/1996 | "DiStefano et al." ................ 437/209 |
| 5,540,378 | * | 7/1996 | Mahulikar et al. . |
| 5,629,239 | | 5/1997 | "DiStefano et al. " ................ 216/14 |
| 5,684,329 | * | 11/1997 | Serizawa . |
| 5,801,436 | * | 9/1998 | Seriza . |
| 5,821,609 | | 10/1998 | "DiStefano et al. " ............. 257/669 |
| 5,830,782 | | 11/1998 | "DiStefano et al. " ............. 438/123 |
| 5,859,472 | | 1/1999 | "DiStefano et al. " ............. 257/674 |
| 5,880,520 | * | 3/1999 | Ma . |
| 5,914,532 | * | 6/1999 | Akagi et al. . |
| 5,958,607 | * | 9/1999 | Kine et al. . |
| 5,994,222 | | 11/1999 | "Smith et al." ...................... 438/689 |
| 5,994,767 | * | 11/1999 | Huang et al. . |
| 6,034,422 | * | 3/2000 | Horita et al. . |

OTHER PUBLICATIONS

Transformational Superelasticity in Sputtered Titanium-–Nickel Thin Films, Li Hou and D.S. Grummon, Scripta Metallurgia et Materialia, vol. 33, No. 6 pp. 989–995, 1995, Elsevier Science Ltd., 0956–716X(95)00311–8.

Orthorhombic Martensite, Intermetallic Precipitates and Retained Austenite in Ti–Rich Ti (Ni+Cu) Sputtered Thin Films, L. Chang and D.S. Grummon,Dept. of Metallurgy, Mechanics and Materials Science, Mat. Res. Soc. Symp. Proc. vol. 246, 1992.

* cited by examiner

*Primary Examiner*—Sheila V. Clark
(74) *Attorney, Agent, or Firm*—Lerner, David, Littenberg, Krumholz & Mentlik, LLP

(57) ABSTRACT

A layered lead is disclosed including a layer of structural material which has top and bottom sides, a layer of fatigue-resistant material on the top and bottom surfaces and a layer of bonding material covering the fatigue-resistant layer on the bottom surface for connection to a contact on a chip. An asymmetrical distribution of bonding material on the top and bottom sides may be used to provide reinforcement of the lead against stress. The fatigue-resistant material also acts as a barrier against diffusion between the metal layers.

64 Claims, 5 Drawing Sheets

LAYERED LEAD STRUCTURES

CROSS REFERENCE TO RELATED APPLICATIONS

This application claims benefit of U.S. Provisional Application Serial Nos. 60/063,316 filed Oct. 27, 1997, 60/065,992 filed Nov. 14, 1997, and 60/079,194 filed Mar. 24, 1998, the disclosures of which are hereby incorporated by reference herein.

FIELD OF THE INVENTION

The present invention relates to connection components useful in electrical assemblies such as in connecting semiconductor chips to substrates, and to methods of making such connection components.

BACKGROUND OF THE INVENTION

Semiconductor chips typically are connected to external circuitry through contacts on the surface of the chip. The contacts may be disposed in a grid on the front surface of the chip or in elongated rows extending along the edges of the chip's front surface. Each such contact must be connected to an external circuit element such as a circuit trace on a supporting substrate or circuit panel. The rapid evolution of the semiconductor art has created continued demand for incorporation of progressively greater numbers of contacts and leads in a given amount of space. With such closely spaced contacts, the leads connected to the contacts of the chip must be extremely fine structures, typically less than about 0.1 mm wide, disposed at center-to-center spacing of about 0.1 mm or less. Handling and connecting such fine, closely-spaced leads poses a formidable problem.

Leads are commonly bonded to contacts on semiconductor chips or other microelectronic elements by a process such as ultrasonic bonding or preferably thermocompression or thermosonic bonding. In the bonding process, the bonding region of each lead is engaged by a bonding tool which bears on the top surface of the lead in the bonding region and forces the lead downwardly into engagement with the contact. Energy supplied through the bonding tool causes the lead to joint with the contact.

After the lead is bent into a vertically-curved configuration and bonded to the semiconductor chip contacts, the region adjacent the bonding region is formed. This region is commonly referred to as the "heel" of the lead, i.e., the upwardly curving region close to the contacts on the bond side of the lead. The heel of the lead is typically the most fatigue-susceptible region of the lead. Other curved portions of the lead are also susceptible to fatigue.

Methods of making various lead connections involve deformation of the lead, forming curved portions in the leads. Examples include conventional tape automated bonding ("TAB"), and the methods disclosed in U.S. Pat. Nos. 5,489,749, 5,491,302, 5,629,239, and 5,518,964, the disclosures of which are hereby incorporated by reference herein. As further discussed in these patents, leads can be provided on dielectric layers having gaps such that the leads extend into or across the gaps. To form connections, the leads can be bent downwardly towards contacts on another surface. The leads have the bent configuration as depicted in the drawings. The leads may include a polymer layer. Preferably, the polymer layer is absent in the bond region, or any part of the bond region engaged by the bonding tool, to permit sufficient energy coupling between the tool and the bond interface. Combined metal and polymer lead structures are shown in the above-mentioned '749 Patent and in U.S. patent application Ser. No. 08/715,571, the disclosure of which is also hereby incorporated by reference herein.

As described in the aforementioned patents, the leads may extend on either side of the dielectric layer included in the support structure. Thus, the lead may extend on the top surface of the dielectric layer, remote from the chip or other element having contacts to which the leads are bonded. However, the lead may also extend across the dielectric layer on the bottom surface. Also, the support structure need not include a dielectric layer, but instead may include a metallic lead frame which is used to hold leads temporarily and which is removed from the leads during or after bonding.

Connection components formed as discussed above typically have a reduced fatigue life. It is therefore desirable to provide leads with a structure which reinforces the lead, particularly in the most fatigue-susceptible regions of the lead. The most fatigue-susceptible regions of the lead are those regions which were most distorted in the fabrication of the component. Reinforcing at least these regions enhances the fatigue life of the completed assembly. It is therefore desirable to provide a lead structure which resists distortion. It is also desirable to provide a lead structure which is reinforced against fatigue and which promotes more efficient coupling of energy between the bonding tool and the bond interface between the bottom of the lead and the contact. This in turn allows reduced bonding force, bonding energy and/or bonding time, or provides a stronger bond with the same force, energy and time so that connection components can be fabricated more economically.

SUMMARY

The present invention addresses these needs.

Leads, including flexible leads, used in semiconductor chip assemblies and other microelectronic assemblies can be provided with substantially enhanced fatigue resistance by providing a layer of a fatigue-resistant alloy. The lead typically includes a structural material which may be copper, gold, alloys of these metals or other metals. The lead is provided with a thin layer of the fatigue-resistant alloy. This layer desirably extends on the bonding or bottom side of the lead, i.e., the side of the lead which is bonded to a contact. The fatigue-resistant alloy layer may extend on other sides of the structural material. Most preferably, the layer of fatigue-resistant alloy is provided at least in the bond region, i.e., the region of the lead which is bonded to the contact in use. Preferably, the fatigue-resistant alloy is also provided in the adjacent region of the lead. This adjacent region forms which is commonly referred to as the "heel" of the bond, i.e., the region close to the contact on the bond side of the lead. The fatigue-resistant alloy optionally may extend on other parts of the lead as well. For example, it is advantageous to provide the fatigue resistant alloy in the "shoulder" region of the lead, or other bent regions.

Typically, the fatigue-resistant alloy does not provide an optimum surface on the bond side of the lead for engagement with the contact during the bonding process. Therefore, a layer of a readily bondable material such as gold, palladium or other metal compatible with the contact to which the lead is to be bonded is applied on the bond side of the lead covering the fatigue-resistant alloy at least in the area of the lead which will engage the contact during use.

The fatigue-resistant alloy and particularly nickel titanium alloys, can also serve as a diffusion barrier to retard diffusion of materials from the contact into the structural metal of the lead or vice-versa. Such diffusion can result in formation of brittle intermetallic compounds. Similarly, where the lead includes a structural material such as copper on one side of the fatigue-resistant metal and a more bondable material such as gold on the other side, the fatigue-resistant metal retards mingling of the two metals by diffusion prior to bonding.

Leads in accordance with another aspect of the present invention are provided with an asymmetrical distribution of bonding metal at least in the bond region of the lead. The lead incorporates a layer of a structural metal, desirably copper, copper-based alloy or other relatively low-cost metal. A first layer of a readily bondable metal is provided on the bottom surface of the structural metal layer. To provide the asymmetrical distribution of bonding material, the top surface of the structural metal layer may be devoid of the bonding metal in the bond region or else may have a second layer of bonding metal which is thinner than the first layer of bonding metal. Typically, the first layer of bonding metal is thinner than the structural metal. Preferably, a layer of bonding material surrounds the lead on all surfaces, as opposed to just the top and bottom surfaces of the layer of structural material.

A layer of a barrier metal which is adapted to retard alloying of the structural metal and the bonding metal by diffusion optionally may be provided between the structural metal layer and the first layer of bonding metal. The barrier metal layer typically is thinner than the first layer of bonding metal. The barrier layer may include a fatigue-resistant alloy as taught in the prior applications referred to above. A similar barrier layer can be provided between the structural metal and the second layer of bonding metal, if such second layer is used. The leads typically are provided on a support structure such as a dielectric layer.

In use, the leads are bonded to contacts on a microelectronic element, such as a chip or wafer. In the bonding process, the bonding region of each lead is engaged by a bonding tool which permanently bonds the lead to the contact. The bonding tool tends to distort the top surface of the lead. However, the relatively hard structural metal at or near the top surface of the lead resists such distortion. Thus, leads according to the present invention will also distort less than a lead formed with a symmetrical distribution of bonding material on top and bottom surfaces and hence with a thick layer of bonding material at the top. This enhances the fatigue life of the completed assembly and promotes more efficient coupling of energy between the bonding tool and the bond interface between the bottom of the lead and the contact.

As the bonding metal typically has better fatigue resistance than the structural metal, the bonding metal layer preferably is also provided in the bonding region and heel portions of the lead. The bonding material optionally may extend on other parts of the lead, such as the "shoulder" region of the lead, or other bent regions where the fatigue resistance of the bonding material is useful.

The present invention can be employed with leads of various components, including conventional tape automated bonding ("TAB") leads and those depicted in U.S. Pat. Nos. 5,489,749; 5,491,302; 5,629,239; and 5,518,964. The invention can also be employed in leads which include a polymer layer and one or more metallic conductive layers, preferably including the fatigue-resistant layers on the surface of each metal layer remote from the polymer layer. Combined metal and polymer lead structures are shown in the above-mentioned U.S. Pat. No. 5,489,749, and in U.S. patent application Ser. No. 08/715,571.

As further described in the aforementioned patents, the leads may extend on either side of a dielectric layer of a component. Also, the support structure need not include a dielectric layer, but instead may include a metallic lead frame which is used to hold the leads temporarily and which is removed from the leads during or after bonding. Leads according to the present invention may also comprise flexible leads in a microelectronic connection component.

In accordance with one embodiment of the present invention there is disclosed a microelectronic lead element for connecting first and second microelectronic elements, the lead element comprising a layered structure including a layer of structural material having top and bottom sides and a bonding region for engagement with a contact on one of the microelectronic elements, and a layer of fatigue-resistant material different from the structural material extending on at least one of the top and bottom sides.

In accordance with another embodiment of the present invention there is disclosed a microelectronic connection component comprising a supporting structure and one or more leads connected to the supporting structure, each lead including a layered structure including a layer of a structural material having top and bottom sides and a bonding region for engagement with a contact on a microelectronic element, and a layer of fatigue-resistant material different from the structural material extending on at least one of the top and bottom sides.

In accordance with another embodiment of the present invention there is described a microelectronic lead element for connecting first and second microelectronic elements, the lead element comprising a layered structure including a layer of a structural material having top and bottom sides and a bonding region for engagement with a contact on one of the microelectronic elements, and a first layer of bonding material different from the structural material on the bottom side at least in the bonding region, the top side in the bonding region having either no bonding material thereon or a second layer of bonding material thinner than the first layer to provide an asymmetrical distribution of the bonding material on the lead.

In accordance with another embodiment of the present invention there is described a microelectronic connection component comprising a supporting structure and one or more leads connected to the supporting structure, each lead including a layered structure including a layer of a structural material having top and bottom sides and a bonding region for engagement with a contact on a microelectronic element, and a first layer of bonding material different from the structural material on the bottom side at least in the bonding region, the top side in the bonding region having either no bonding material thereon or a second layer of bonding material thinner than the first layer to provide an asymmetrical distribution of the bonding material on the top and bottom sides.

BRIEF DESCRIPTION OF THE DRAWINGS

These and other features, aspects, and advantages of the present invention will become better understood with regard to the following description, appended claims and accompanying drawings where:

DETAILED DESCRIPTION

A microelectronic component incorporating leads in accordance with one embodiment of the invention is shown in FIGS. 1 through 4. As used herein, the term "microelectronic component" or "component" refers to semiconductor chips, wafers, circuit boards, interposers, and any other electrical assembly incorporating conductive elements such as leads and which are useful in mounting and connecting electronic devices such as semiconductor devices.

Several components will be described below which will be understood as several applications of leads constructed in accordance with the invention and should be taken by way of example, as opposed to limitation. For example, in some applications of the invention, the leads include a frangible portion, whereas, in other applications, a frangible portion is not included.

Figure 4:
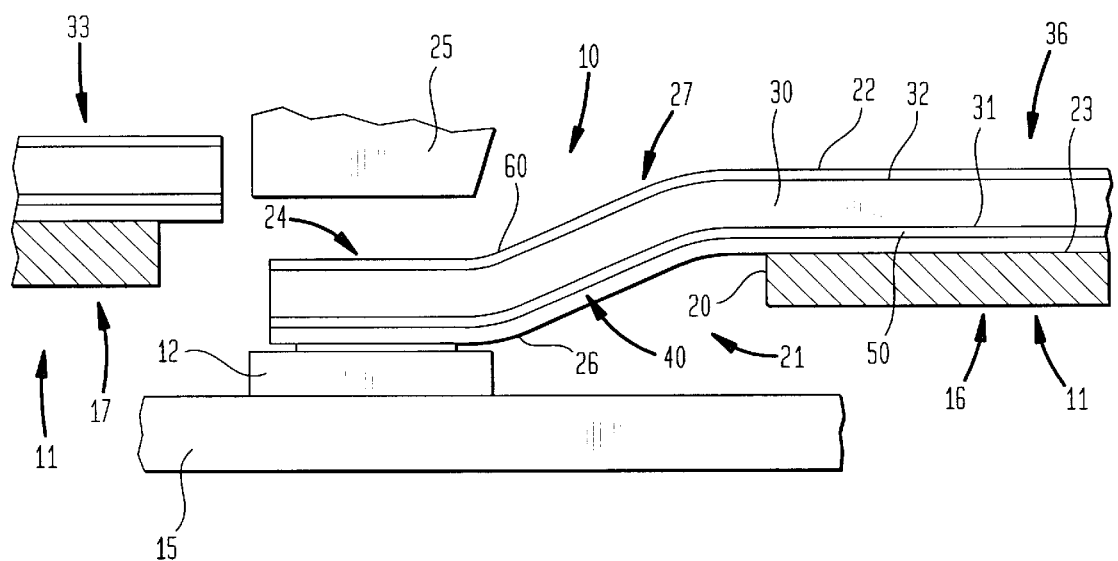
FIG. 4 is a fragmentary, diagrammatic cross-section view of the leads and component of FIGS. 1–3 at a later stage in a manufacturing process in accordance with an embodiment of the invention.

The leads 10 are shown in FIG. 4 on a supporting structure 11 bonded to contacts 12 on a microelectronic element, such as a chip 15. Edge 20 forms gap 21 across which leads 10 extend to the chip and contact 12.

Figure 1:
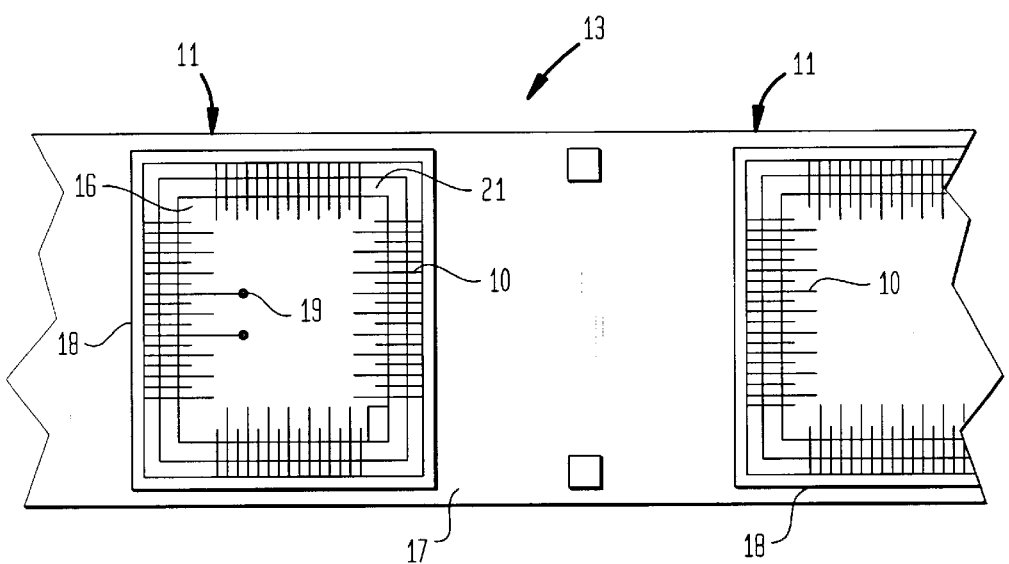
FIG. 1 is a fragmentary, diagrammatic plan view of a component incorporating leads constructed in accordance with one embodiment of the invention.
Figure 2:
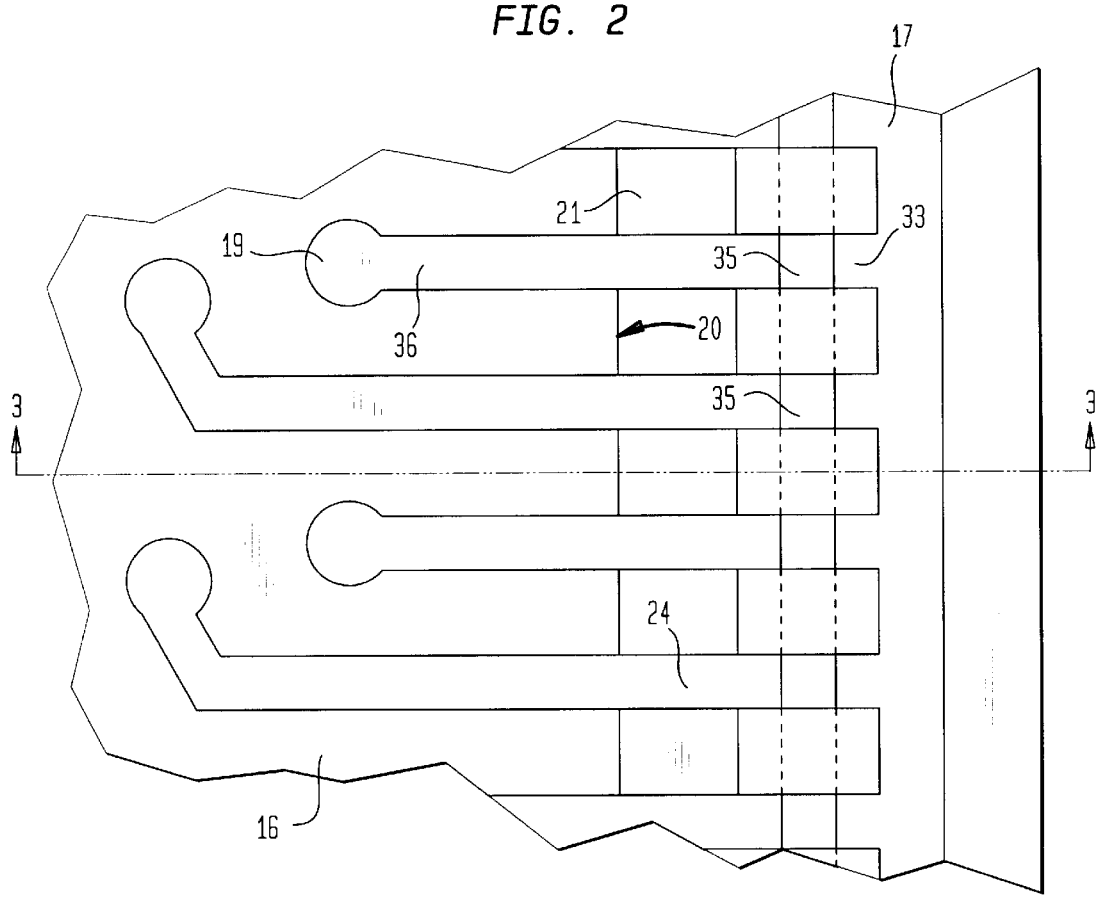
FIG. 2 is a fragmentary, diagrammatic top plan view of the leads and depicting a portion of the component of FIG. 1.
Figure 3:
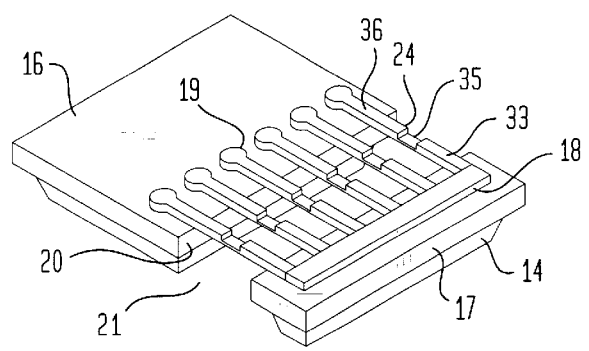
FIG. 3 is a fragmentary, diagrammatic perspective view of the leads and depicting a portion of the component of FIGS. 1–2.

The supporting structure 11, as shown in FIG. 1, may comprise a flexible, sheet-like dielectric layer incorporated in a tape 13. A compliant layer 14, as best seen in FIG. 3, is desirably provided beneath the dielectric layer 11. The support structure 11 of each component has gaps 21 dividing the support structure 11 into a central portion 16 and a peripheral portion 17. The tape may be provided with features such as sprocket holes to facilitate the production process, as used in tape automated bonding methods.

A plurality of elongated electrically conductive buses 18 extend on the peripheral portion 17 of the dielectric layer alongside the gaps 21, forming a loop around the central portion 16 and the gaps 21. Terminals 19 are disposed on the central portion 16 of the supporting structure 11 and a plurality of leads 10 extend outwardly from the terminals, across the gaps 21 to the bus 18. Although only a few leads 10 and terminals 19 are illustrated in the drawings, it should be appreciated that a typical component may include hundreds of leads and terminals. The terminals 19, although illustrated in FIGS. 1–4 disposed side by side, are typically distributed over substantially the entire central portion of the support structure 11.

A lead 10 in accordance with the invention may include a securement section 33 on peripheral portion 17 of the support structure, a frangible section 35 extending outwardly across one of the gaps 21 from the securement section 33, a bonding region 24 joined to the frangible section, and a terminal section 36 on central portion 16 attached to the terminals 19 remote from securement section 33. As seen in FIG. 3, the frangible section 35 lies above gap 21.

The supporting structure having leads 10 thereon may be manufactured by forming the leads and bus on a dielectric layer using additive electroplating or subtractive etching processes known in the art. One method of forming frangible sections in the leads is to provide a mask to protect the desired portions of the dielectric layer and leads while a laser is applied to form the frangible sections 35 in the leads 10. A second mask protects the dielectric layer while a laser forms the gaps 21 in the dielectric layer in registration with the frangible sections 35. The supporting structure 11 with leads may be manufactured as more fully described in the U.S. Pat. No. 5,629,239, incorporated by reference herein. Other structures and methods are disclosed in U.S. Pat. Nos. 5,489,749; 5,821,609, the disclosures of which are hereby incorporated by reference herein, and U.S. patent application Ser. Nos. 08/845,786 and 09/110,001, the disclosures of which are hereby incorporated by reference herein, and U.S. Provisional Application Nos. 60/085,891 and 60/087,801, the disclosures of which are hereby incorporated by reference herein.

As best seen in FIG. 4, each lead 10 has a top surface 22 remote from the supporting structure 11 and a bottom surface 23 of the lead 10 is connected to the supporting structure 11. The lead has a layered structure including a layer of structural material 30, which is desirably copper, a copper-based alloy, gold, alloys or composites of these metals, or a relatively low-cost metal, with a bottom surface 31 facing the chip 15 and a top surface 32 facing away from the chip 15.

The lead 10 also includes a first layer of fatigue-resistant material 50, different from the structural material, on the bottom surface 31 of the layer of structural material 30. The first layer of fatigue-resistant material 50 is a fatigue-resistant alloy such as the alloys commonly referred to as shape memory alloys, "pseudoelastic alloys" or "superelastic alloys". Typical fatigue-resistant alloys include NITINOL™, an alloy including nickel and titanium, as well as certain alloys of thallium and indium, and copper-aluminum-nickel alloys. A less preferred material is a thallium cadmium alloy. In the embodiment shown in FIGS. 1 through 4, the fatigue-resistant layer 50 is about 10 microns thick, but is preferably only a few microns thick or less.

The fatigue-resistant layer desirably extends on the bottom surface 31 of the layer of structural material 30. Preferably, the fatigue-resistant layer extends in the bond region 24 of the lead extending into the heel portion 26 and most preferably on any fatigue susceptible region of the lead. Other fatigue susceptible regions include the shoulder portion 27. These portions are formed during the bonding process and will be further discussed below.

The first layer of fatigue-resistant alloy does not provide an optimum surface on the bond side of the lead for engagement with the contact 12 during the bonding process. Therefore a layer of bondable material 40, a readily bondable metal such as gold, gold-based alloy (e.g., having about 50% gold or more) or palladium or another metal compatible with the contact, is provided on the bottom surface 23 of the lead over the first fatigue-resistant layer 50 so that the lead 10 may be bonded to the contact 12.

The layer of bonding material 40 is preferably thinner than the layer of structural material 30. Preferably, the structural metal is about 8µ to about 20µ thick and the layer of bonding material 40 is about 1µ to about 6µ thick. Leads in accordance with the invention in embodiments discussed below may be provided with layers having about these thicknesses. In some application, however, the thicknesses will vary, as can be appreciated by those of ordinary skill in the art.

On top surface 32 of the structural material 30 a second layer of fatigue-resistant material 60 may optionally be provided. This layer 60 is comprised of fatigue-resistant alloys and otherwise similar to layer 40. The layered structure of the leads 10 can be formed by processes known in the art, such as sputtering, evaporation, or plating. Using these and other techniques known in the art, each of the above-mentioned layers of the lead 10 may be formed.

The fatigue-resistant alloy is preferably a nickel titanium alloy and preferably serves as a diffusion barrier to retard diffusion of materials from the contact 12 into the structural metal 30 of the lead or vice versa. Such diffusion can result in formation of brittle intermetallic compounds. Similarly, where structural materials such as copper is disposed on one side of the fatigue-resistant metal and a more bondable materials such as gold on the other side, the fatigue-resistant metal retards intermingling of the two metals by diffusion prior to bonding. Thus, the copper does not diffuse into the gold and therefore cannot form copper oxide on the gold. In addition, diffusion leads to the creation of voids within the material, which is also known in the field as Kirkendall Voiding.

In the bonding process, as best seen in FIG. 4, the bonding regions 24 of leads 10 are bonded to the contacts 12 on the chip or other microelectronic element 15 by a process such as ultrasonic bonding or preferably thermocompression or thermosonic bonding. The supporting structure 11 with leads thereon is positioned on the chip 15 so that rows of contacts 12 are aligned with gaps 21 and the leads 10. The bonding region 24 of each lead 10 is engaged by a bonding tool 25 which bears on the top surface 22 of the lead in the bonding region and forces the lead downwardly into engagement with the contact 12. As the tool 25 moves each lead 10 downwardly toward the contact 12, frangible portion 35 breaks, as described more fully in U.S. Pat. No. 5,629,239. The bonding region 24 is moved into engagement with the contact. The lead is then permanently bonded to contact 12 by the tool.

The bonding tool 25 tends to distort the top 22 and bottom surfaces 23 of the leads. As seen in FIG. 1, the lead takes on a curved shape after being manipulated by the bonding tool 25 and displaced downwardly toward the contact 12. The curved portion closest contact 12 is an upwardly curved portion called the "heel" 26 of the lead. The heel portion, adjacent the bonding region 24, was distorted from its originally planar shape to an upwardly curved shape by the bonding tool 25. Another curved portion formed in the bonding process, adjacent the terminal section 36 on the central portion 16 of the supporting structure 11, is the "shoulder" 27 portion. The shoulder portion was distorted from its originally planar shape to a downwardly curved shape by the bonding tool. It is believed that the shoulder and heel portions are the most fatigue-susceptible portions of the lead in the connection component, being the most distorted region.

Although the present invention is not limited by any theory of operation, it is believed that fatigue cracks begin on the surface of the structural metal and propagate into the structural metal. Even a very thin layer of the fatigue-resistant alloy is believed to prevent or delay initiation of the fatigue cracks at the surface, or to arrest the propagation of such cracks. It is believed to be particularly advantageous to provide fatigue-resistant layer in the bonding region 24 on the bottom side 23 of the lead 10, extending into the region which will form the heel region 26, as it is believed that fatigue cracks tend to begin at this region of the lead. A layer of fatigue-resistant material in the shoulder 27 portion is similarly believed to reduce fatigue cracks in this region as well. Hence, the lead 10 shown in FIG. 4 has fatigue-resistant layer 60 in the shoulder portion 27 and fatigue-resistant layer 50 in the bond and heel portions 24 and 26.

In another embodiment similar to the one illustrated in FIGS. 1 through 4, the fatigue-resistant layers are provided only in the bonding region, extending into the heel region on the bottom surface of the lead or on the top surface of the lead in the shoulder region, or other bent regions. Similarly, in other embodiments, the bonding material is provided on the bottom surface of the lead covering the fatigue-resistant material in the area of the lead which will engage the contact during the bonding process.

Figure 5:
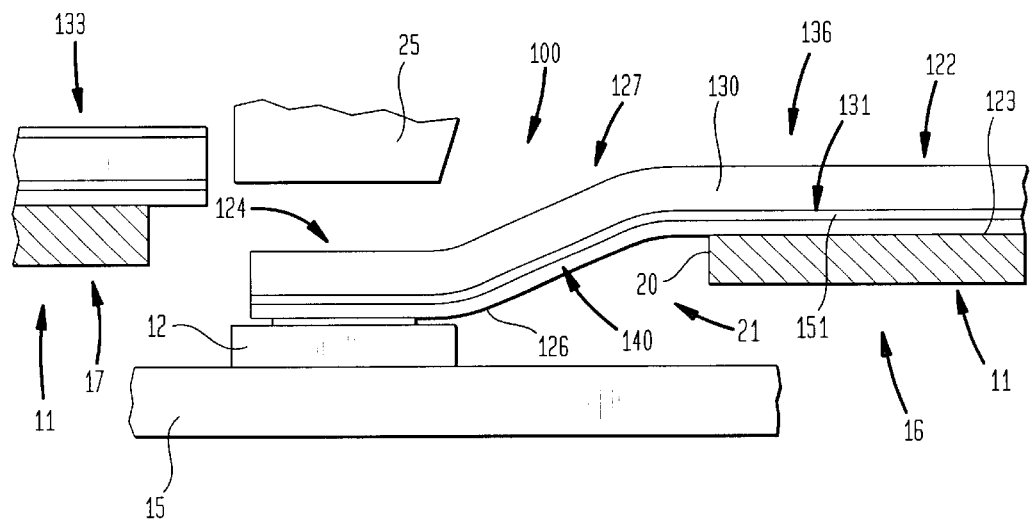
FIG. 5 is a fragmentary, diagrammatic cross-section view of another component incorporating leads in accordance with another embodiment of the invention.

In another embodiment of the invention shown in FIG. 5, an asymmetrical distribution of bonding material is provided to reinforce lead 100 in the heel 126 and/or shoulder 127 portions of the lead 100. Thus, the tape incorporating a supporting structure 11 discussed above has leads 100 including a layer of structural metal 130 and a layer of the bonding material 140 in the bond region 124 of the lead and also desirably extending into the heel 126 of the lead on the bottom surface 123 of the lead. The layer of bonding material 140 is preferably gold, a gold-based alloy, etc., as discussed above. Preferably, the layer of bonding material 140 surrounds the lead on all surfaces, as opposed to just the top and bottom surfaces of the layer of structural material. The layer of structural material 130 in this embodiment is preferably copper, which reduces the cost of the lead as compared to a gold layer of structural material discussed in connection with FIG. 4.

A barrier layer 151 may also be provided on the bottom surface 131 of the structural metal layer. The barrier layer 150 is desirably comprised of a nickel or nickel-based alloy for resisting diffusion between the layers of structural and bonding material. Preferably, the barrier layer includes a fatigue-resistant alloy, as discussed above. In this embodiment, the top surface 122 of the lead is devoid of the bonding material in the bond region 124.

Due to the asymmetrical layered structure of the lead, the relatively hard structural metal near the top surface of the lead resists distortion during the bonding process. Thus, the lead will be distorted to a lesser degree than leads formed entirely from the relatively soft bonding material. The leads will also distort less than leads formed with a symmetrical distribution of bonding material on the top and bottom surfaces. Reduced distortion tends to reduce stress concentrations arising at the distorted region of the lead. This enhances the fatigue life of the completed assembly. Moreover, the relatively stiff, hard top surface of the leads promotes more efficient coupling of energy between the bonding tool and bond interface between the bottom of the lead and the contact. Leads according to the present invention can be fabricated more economically than leads of solid gold and/or leads with symmetrical bonding material distribution.

Figure 6:
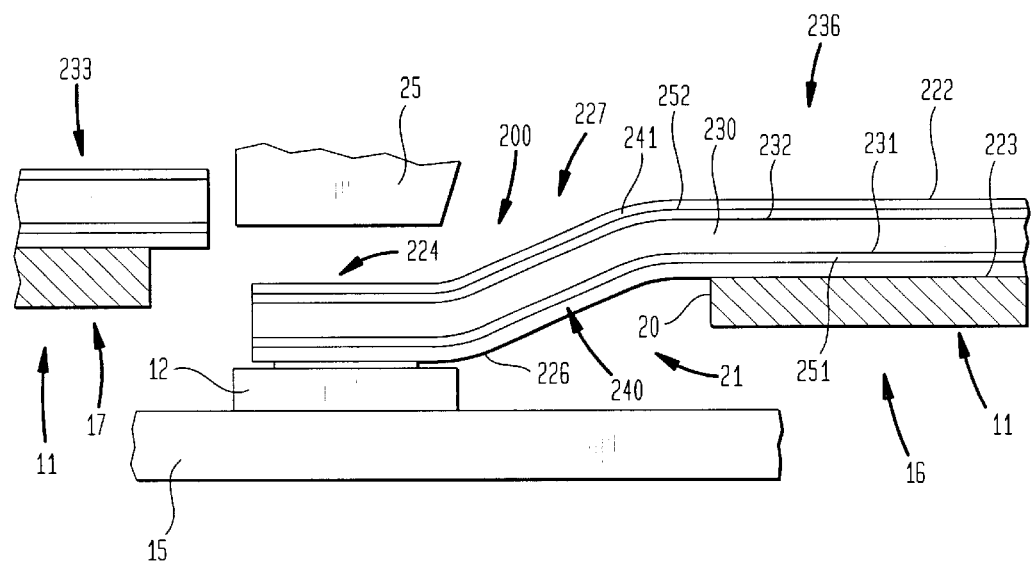
FIG. 6 is a fragmentary, diagrammatic cross-section view of a further component incorporating leads in accordance with a further embodiment of the invention.

In another embodiment of the invention shown in FIG. 6, an asymmetrical distribution of bonding material is also provided. A tape incorporating the supporting structure 11 has leads 200 including a layer of structural material 230 having a bottom surface 231 facing the chip 15 and a top surface 232 facing away from the chip 15. A layer of bonding material 240 forms the bottom surface 223 of the lead 200, preferably in the bonding region 224. The top surface 222 of the lead 200 has a second layer of bonding material 241 with a thickness less than the first layer of bonding material 240 in regions where the lead has a layer bonding material 240 on the bottom surface 223.

A barrier layer 251 is preferably disposed between the layer of structural material 230 and the layer of bonding material 240. Similarly, a second barrier layer 252 is preferably disposed between the layer of structural material 230 and the second layer of bonding material 241. The barrier layers 251 and 252 reduce diffusion and most preferably include a fatigue-resistant alloy as discussed above.

During the bonding process, bonding tool 25 engages the bonding region 224 of the lead, forcing the lead downwardly toward chip 15 and contact 12 thereon. The bonding tool 25, as described above, forms the heel portion 226 and shoulder portion 227 in the lead. These portions are reinforced against fatigue by the asymmetrical bonding material distribution in layers 241 and 240. The asymmetrical distribution arises from the thinner layer of bonding material 241 at the top surface 222 of the lead and the thicker layer 240 of bonding material forming the bottom surface 223 of the lead. Barrier layers 251 and 252 are provided to resist diffusion as discussed above between the layers of structural metal and bonding material. Preferably, the barrier layers include a fatigue-resistant alloy also as discussed above.

Figure 7:
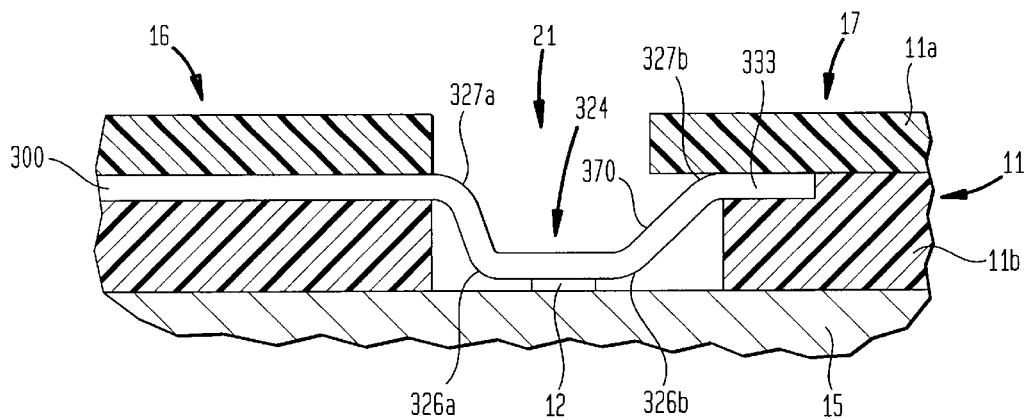
FIG. 7 is a fragmentary, diagrammatic cross-section view of yet another application of leads in accordance with the invention in a component.

FIG. 7 shows another application of the invention, in a component which does not include the frangible sections discussed above. The supporting structure 11 of this type of component includes a top layer 11A and a bottom layer 11B. Prior to the bonding process, the bond region 324 extends across gap 21 in the support structure 11. As more fully described in U.S. Pat. No. 5,489,749, incorporated by reference herein, a securement section 333 is permanently mounted to the support structure in the peripheral portion 17. The bond tool 25 (not shown) engages the bond portion 324 of the lead 300, displacing the lead 300 downwardly. A portion of the lead 370 peels away from the top layer 11A to permit downward displacement of the bond region 324. The securement section 333 remains loosely attached to the support structure 11. The bond region 324 is permanently bonded to contact 12 on chip 15.

In the bonding process, lead 300 is deformed to create a pair of heel portions 326A and 326B and a pair of shoulder portions 327A and 327B similar to the heel and shoulder portions discussed above. These portions are also believed to be fatigue-susceptible portions of the lead. Thus, lead 300 may be provided with fatigue-resistant layers preferably in regions 326A, 326B, 324, 327A and 327B to prevent the fatigue cracks discussed above in connection with the embodiment of FIGS. 1 through 4. Alternatively, the lead 300 may be provided with an asymmetrical distribution of bonding material on the bottom and top surfaces of the lead to reduce stress in distorted regions, as discussed above in connection with the embodiments of FIGS. 5 and 6.

Figure 8:
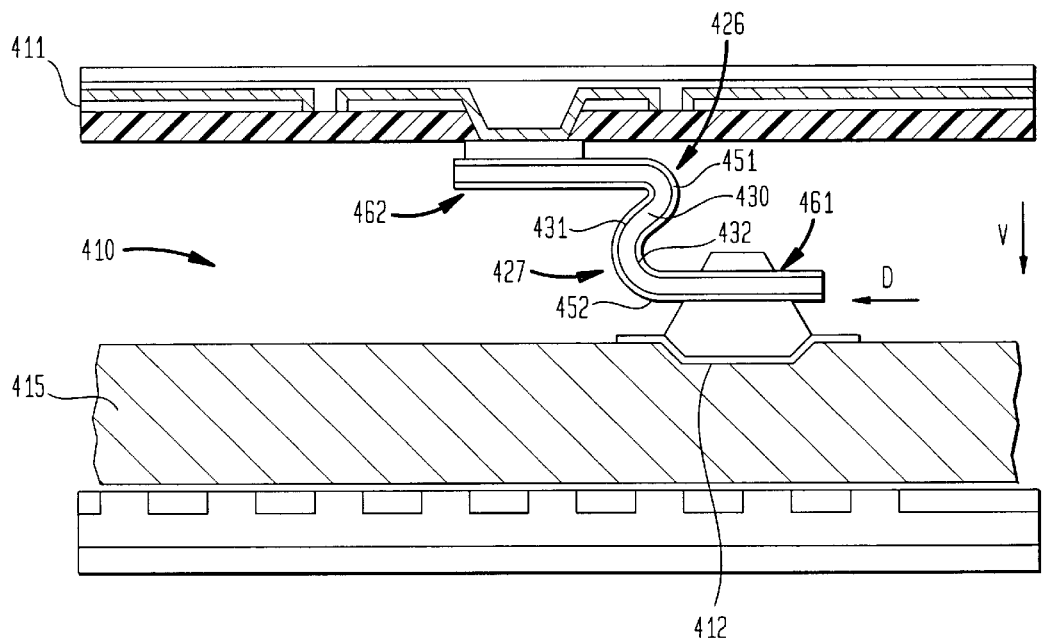
FIG. 8 is a fragmentary, diagrammatic cross-section view of yet another application of leads in accordance with the invention in a component.

Leads may have other distorted portions which are relatively fatigue-susceptible portions of the leads. FIG. 8 illustrates another application of the invention in which an S-shaped lead 410 is attached to contact pads 412 on wafer 415 at a tip end 461 of the lead and also attached to a terminal on a dielectric sheet 411 at a terminal end 462. The wafer includes a series of semiconductor chips. The S-shaped lead was formed by displacing the wafer with respect to the sheet 411 vertically in the V direction and horizontally in the D direction shown in FIG. 8 and more fully described in U.S. Pat. No. 5,518,964. Curved portions, a first bight 426 and a second bight 427, are formed. Other alternative lead shapes are disclosed in U.S. patent application Ser. Nos. 08/678,808 (expected to issue as U.S. Pat. No. 5,830,782), 08/712,855, and 08/927,601, the disclosures of which are hereby incorporated by reference herein.

To prevent fatigue cracks in the first bight 426 of lead 410, a first layer of fatigue-resistant material 451 is provided on a top surface 432 of a layer of structural material 430. Likewise, a layer of fatigue-resistant material 452 is also provided on a bottom surface 431 of the layer of structural material 430, to prevent fatigue cracks in the second bight 427. Preferably, the first and second layers 451 and 452 of fatigue-resistant material extend in the region of the first and second bights 426 and 427. The layers of fatigue-resistant material may be provided as discussed above in connection with FIG. 4. Bonding material is preferably provided over the second layer 452 of fatigue-resistant material at the tip end 461 of lead 410, as discussed in more detail in U.S. Pat. No. 5,518,964, to form the connection with the contact 412. The S-shaped leads may also be provided with an asymmetrical distribution of bonding material without a fatigue-resistant layer, as discussed above.

To reduce stress in, for example, the first bight 426 of the lead 410, an asymmetrical distribution of bonding material on top and bottom surfaces 432 and 431 may be provided. The layers of the structural material 430, as discussed above in connection with FIGS. 5 and 6, preferably include a diffusion barrier layer. The asymmetrical distribution of bonding material comprises either a first layer of bonding material on the top surface 432 and a second layer of bonding material on the bottom surface 431 having a smaller thickness than the first, or the bottom surface 431 is devoid of bonding material and the top surface 432 includes the layer of bonding material.

Figure 9:
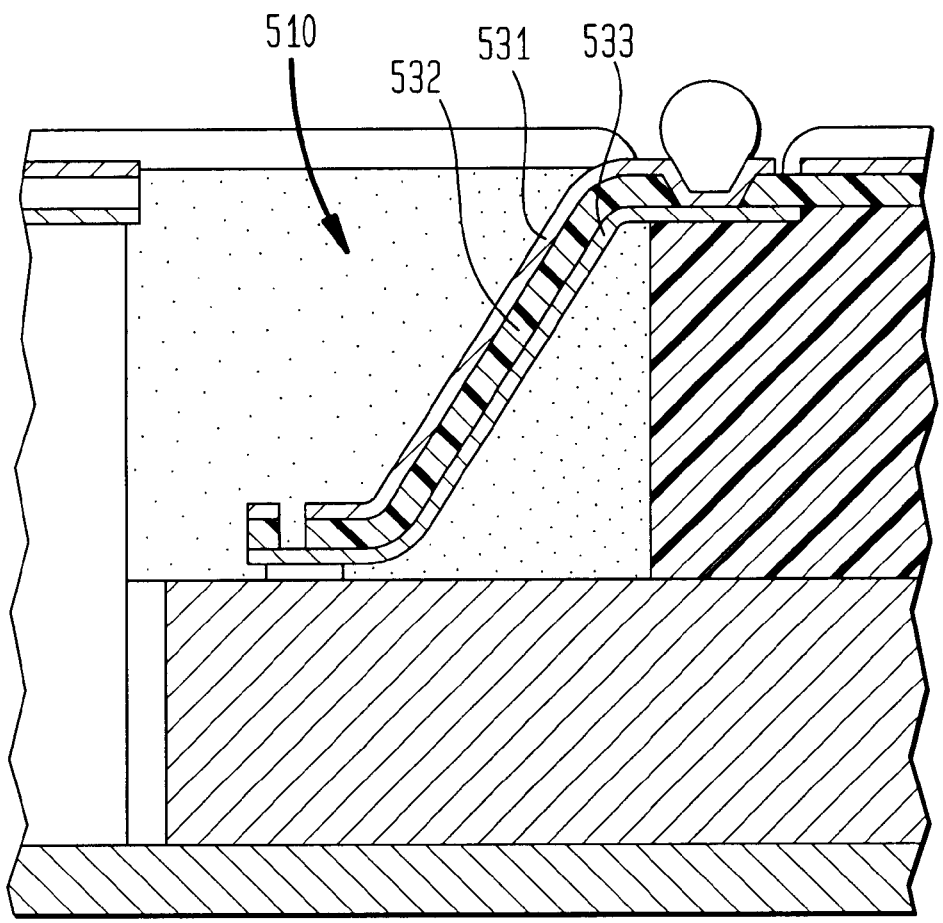
FIG. 9 is a fragmentary, diagrammatic cross-section view of a still further component incorporating leads in accordance with yet another embodiment of the invention.

The invention can also be employed in leads 510 which include a polymer layer 532 and one or more metallic conductive layers 531 and 533 illustrated in FIG. 9. Metal layers 531 and 533 are provided on opposite surfaces of the polymer layer 532 and the fatigue-resistant metal may be disposed on the surface of each metal layer 531 and 533 remote from the polymer layer 532. Combined metal and polymer lead structures are shown in U.S. Pat. No. 5,489,749 and in U.S. patent application Ser. Nos. 08/715,571, and 09/020,754 the disclosures of which are hereby incorporated by reference herein.

As these and other variations and combinations of the features discussed above can be utilized without departing from the present invention as defined by the claims, the foregoing description of the preferred embodiments should be taken as illustrating, rather than limiting, the invention as claimed.

We claim:

1. A microelectronic lead element for connecting first and second microelectronic elements, said lead element comprising a layered structure including a layer of structural material having top and bottom sides and a bonding region for engagement with a contact on one of said microelectronic elements, and a layer of fatigue-resistant material different from said structural material extending on at least a portion of one of said top or bottom sides.

2. The microelectronic lead element as claimed in claim 1, wherein said lead element includes curved portions and said layer of fatigue-resistant material extends on at least one of said curved portions.

3. The microelectronic lead element as claimed in claim 1, wherein said layer of fatigue-resistant material extends on said bottom side.

4. The microelectronic lead element as claimed in claim 1, wherein said layer of fatigue-resistant material extends on said top and said bottom sides.

5. The microelectronic lead element as claimed in claim 1, wherein said bonding region includes a portion of said bottom side of said structural material for engagement with a contact of a microelectronic element.

6. The microelectronic lead element as claimed in claim 5, wherein said layer of fatigue-resistant material is disposed at least in said bonding region.

7. The microelectronic lead element as claimed in claim 6, wherein said layer of fatigue-resistant material comprises a diffusion barrier material.

8. The microelectronic lead element as claimed in claim 5, wherein said lead element includes an upwardly curved heel portion adjacent said bonding region and said layer of fatigue-resistant material extends on said bottom side at least within said heel portion.

9. The microelectronic lead element as claimed in claim 1, wherein said lead element includes a downwardly curved shoulder portion adjacent said supporting structure and said layer of fatigue-resistant material extends at least within said shoulder portion.

10. The microelectronic lead element as claimed in claim 1, wherein said lead element includes a layer of bonding material different from said fatigue-resistant material, said layer of bonding material being disposed on said layer of fatigue-resistant material adjacent said bottom side in said bonding region.

11. A microelectronic lead element for connecting first and second microelectronic elements, said lead element comprising a layered structure including a layer of structural material having top and bottom sides and a bonding region for engagement with a contact on one of said microelectronic elements, and a layer of fatigue-resistant material different from said structural material extending on at least a portion of one of said top or bottom sides;
   wherein said lead element includes a frangible portion adjacent said bonding region.

12. The microelectronic lead element as claimed in claim 1, wherein said fatigue-resistant layer comprises a shape memory alloy.

13. A microelectronic lead element for connecting first and second microelectronic elements, said lead element comprising a layered structure including a layer of structural material having top and bottom sides and a bonding region for engagement with a contact on one of said microelectronic elements, and a layer of fatigue-resistant material different from said structural material extending on at least a portion of one of said top or bottom sides;
   wherein said fatigue-resistant layer comprises a shape memory alloy;
   wherein said fatigue resistant layer is selected from the group consisting of an alloy of nickel and titanium and an alloy of thallium and indium.

14. The microelectronic lead element as claimed in claim 12, wherein said structural material is selected from the group consisting of copper and copper-based alloys containing more than about 50% copper by weight.

15. A microelectronic lead element for connecting first and second microelectronic elements, said lead element comprising a layered structure including a layer of structural material having top and bottom sides and a bonding region for engagement with a contact on one of said microelectronic elements, and a layer of fatigue-resistant material different from said structural material extending on at least a portion of one of said top or bottom sides;
   wherein the thickness of said fatigue-resistant layer is less than about 10 microns.

16. A microelectronic connection component comprising a supporting structure and one or more leads connected to said supporting structure, each said lead including a layered structure including a layer of a structural material having top and bottom sides and a bonding region for engagement with a contact on a microelectronic element, and a layer of fatigue-resistant material different from said structural material extending on at least a portion of one of said top or bottom sides.

17. The component as claimed in claim 16, wherein said lead includes curved portions and said layer of fatigue-resistant material extends on at least one of said curved portions.

18. The component as claimed in claim 16, wherein said layer of fatigue-resistant material extends on said bottom side.

19. The component as claimed in claim 16, wherein said layer of fatigue-resistant material extends on said top and said bottom sides.

20. The component as claimed in claim 16, wherein said bonding region includes a portion on said bottom side for engagement with a contact of a microelectronic element.

21. The component as claimed in claim 20, wherein said layer of fatigue-resistant material is disposed at least in said bonding region.

22. The component as claimed in claim 21, wherein said layer of fatigue-resistant material comprises a diffusion barrier material.

23. The component as claimed in claim 20, wherein said lead includes an upwardly curved heel portion adjacent said bonding region and said layer of fatigue-resistant material extends on said bottom side at least within said heel portion.

24. The component as claimed in claim 16, wherein said lead includes a downwardly curved shoulder portion adjacent said supporting structure and said layer of fatigue-resistant material extends on said top side at least within said shoulder portion.

25. The component as claimed in claim 16, wherein said lead includes a layer of bonding material different from said fatigue-resistant material, said layer of bonding material being disposed on said layer of fatigue-resistant material adjacent said bottom side in said bonding region.

26. A microelectronic connection component comprising a supporting structure and one or more leads connected to said supporting structure, each said lead including a layered structure including a layer of a structural material having top and bottom sides and a bonding region for engagement with a contact on a microelectronic element, and a layer of fatigue-resistant material different from said structural material extending on at least a portion of one of said top or bottom sides;
   wherein said lead includes a frangible portion adjacent said bonding region.

27. The component as claimed in claim 16, wherein said fatigue resistant layer comprises a shape memory alloy.

28. The component of claim 16, further including a layer of polymer material on said top side of said structural material.

29. The component of claim 16, wherein said supporting structure comprises a dielectric layer.

30. The component of claim 16, wherein said structural material is selected from the group consisting of copper and copper-based alloys containing more than about 50% copper by weight.

31. A microelectronic connection component comprising a supporting structure and one or more leads connected to said supporting structure, each said lead including a layered structure including a layer of a structural material having top and bottom sides and a bonding region for engagement with a contact on a microelectronic element, and a layer of fatigue-resistant material different from said structural material extending on at least a portion of one of said top or bottom sides;

wherein the thickness of said fatigue-resistant layer is less than about 10 microns.

32. A microelectronic assembly made by:
(a) providing a connection component comprising a supporting structure and one or more leads connected to said supporting structure, each said lead including a layered structure including a layer of a structural material having top and bottom sides and a bonding region for engagement with a contact on a microelectronic element, and a layer of fatigue-resistant material different from said structural material extending on at least a portion of one of said top or bottom sides; and
(b) juxtaposing said component with a microelectronic element and bonding said bonding regions of said leads to contacts on said microelectronic element by forcibly engaging the bonding regions of the leads with the contacts by means of a tool disposed above the bonding regions and urging the bonding regions downwardly toward the contacts of the microelectronic element, the tool bearing on the bonding region of each lead,
(c) wherein in said bonding step, said leads are deflected downwardly so as to form each lead into a vertically curved configuration with a bend region curving upwardly away from the contact to which such lead is bonded, each such vertically curved region including a heel region on the downwardly-facing side of the lead in said bend portion, and wherein said layer of fatigue-resistant bonding material of each said lead extends into the heel portion.

33. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead.

34. The microelectronic lead element as claimed in claim 33, wherein said lead element includes an upwardly curved heel portion adjacent said bonding region and said first layer of bonding material extending into said heel portion.

35. The microelectronic lead element as claimed in claim 33, wherein said lead element includes a downwardly curved shoulder portion adjacent said supporting structure and at least one of said layers of bonding material extending on said shoulder portion.

36. The microelectronic lead element as claimed in claim 33, wherein said lead element includes a layer of barrier material disposed between said first layer of bonding material and said layer of structural material.

37. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead;
wherein said lead element includes a layer of barrier material disposed between said first layer of bonding material and said layer of structural material; and
wherein said layer of barrier material has a barrier layer thickness less than the thickness of said first layer of bonding material.

38. The microelectronic lead element as claimed in claim 36, wherein said layer of barrier material comprises a fatigue-resistant alloy.

39. The microelectronic lead element as claimed in claim 38, wherein said fatigue-resistant alloy comprises a shape memory alloy.

40. The microelectronic lead element as claimed in claim 33, wherein said structural material in said bonding region is thicker than the thickness of said first layer of bonding material on said bottom side.

41. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead;
wherein said structural material in said bonding region is thicker than the thickness of said first layer of bonding material on said bottom side; and
wherein said structural material in said bonding region is about $8\mu$ to about $20\mu$ thick, and wherein said first layer of bonding material on said bottom side is about 1 to about $6\mu$ thick.

42. The microelectronic lead element as claimed in claim 33, wherein said bonding material is softer than said structural material.

43. The microelectronic lead element as claimed in claim 33, wherein said bonding material has a modulus of elasticity lower than the modulus of elasticity of said structural material.

44. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead;
wherein said bonding material is selected from the group consisting of gold and gold-based alloys containing more than about 50% gold by weight.

45. The microelectronic lead element as claimed in claim 33 wherein said bonding material consists essentially of gold.

46. The microelectronic lead element as claimed in claim 33 wherein said structural material is selected from the group consisting of copper and copper-based alloys containing more than about 50% gold by weight.

47. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead;

wherein said asymmetrical distribution comprises said first layer of bonding material on said bottom side and said top side is devoid of said bonding material.

48. A microelectronic connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides.

49. The component as claimed in claim 48, wherein said lead includes an upwardly curved heel portion adjacent said bonding region and said first layer of bonding material extending into said heel portion.

50. The component as claimed in claim 48, wherein said lead includes a downwardly curved shoulder portion adjacent said supporting structure and at least one of said layers of bonding material extending on said shoulder portion.

51. The component as claimed in claim 48, wherein said lead includes a layer of barrier material disposed between said first layer of bonding material and said layer of structural material.

52. A microelectronic connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides;

wherein said layer of barrier material has a barrier layer thickness less than the thickness of said first layer of bonding material.

53. The component as claimed in claim 48, wherein said layer of barrier material comprises a fatigue-resistant alloy.

54. The component as claimed in claim 53, wherein said fatigue-resistant alloy comprises a shape memory alloy.

55. The component as claimed in claim 48, wherein said structural material in said bonding region is thicker than the thickness of said first layer of bonding material on said bottom side.

56. A microelectronic connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides;

wherein said structural material in said bonding region is about $8\mu$ to about $20\mu$ thick, and wherein said first layer of bonding material on said bottom side is about 1 to about $6\mu$ thick.

57. The component as claimed in claim 48, wherein said bonding material is softer than said structural material.

58. The component as claimed in claim 48, wherein said bonding material has a modulus of elasticity lower than the modulus of elasticity of said structural material.

59. A microelectronic connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides wherein said bonding material is selected from the group consisting of gold and gold-based alloys containing more than about 50% gold by weight.

60. The component as claimed in claim 48 wherein said bonding material consists essentially of gold.

61. A microelectronic connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides;

wherein said structural material is selected from the group consisting of copper and copper based alloys containing more than about 50% gold by weight.

62. A microelectronic lead element for connecting first and second microelectronic elements, said lead element comprising a layered structure including a layer of a structural material having top and bottom sides and a bonding region for engagement with a contact on one of said microelectronic elements, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said lead;

wherein said bonding material has a modulus of elasticity lower than the modulus of elasticity of said structural material; and wherein said asymmetrical distribution comprises said first layer of bonding material on said bottom side and said top side is devoid of said bonding material.

63. A microelectronic assembly made by:

(a) providing a connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides (b) assembling said component with a microelectronic element and bonding said bonding regions of said leads to contacts on said microelectronic element so that said first layer of bonding material of each bonding region faces downwardly toward a contact and said first layer of bonding material is engaged with the contact;

wherein, in said bonding step, said leads are deflected downwardly so as to form each lead into a vertically curved configuration with a bend region curving upwardly away from the contact to which said lead is bonded, each such vertically curved region including a heel region on the downwardly-facing side of the lead in said bend portion, and wherein said first layer of bonding material of each said lead extends into the heel portion.

64. A microelectronic assembly made by:

(a) providing a connection component comprising a supporting structure and one or more leads connected to said supporting structure, each said lead including a layered structure including a layer of a structural material having top and bottom sides and a bonding region for engagement with a contact on a microelectronic element, and a first layer of bonding material different from said structural material on said bottom side at least in said bonding region, said top side in said bonding region having either no bonding material thereon or a second layer of bonding material thinner than said first layer to provide an asymmetrical distribution of said bonding material on said top and bottom sides; and (b) juxtaposing said component with a microelectronic element and bonding said bonding regions of said leads to contacts on said microelectronic element so that said first layer of bonding material of each bonding region faces downwardly toward a contact and said first layer of bonding material is engaged with the contact.

* * * * *